United States Patent [19]

Read et al.

[11] Patent Number: 4,480,488
[45] Date of Patent: Nov. 6, 1984

[54] FORCE SENSOR WITH A PIEZOELECTRIC FET

[75] Inventors: Eileen Read; Daniel V. McCaughan, both of Buckinghamshire, England

[73] Assignee: The General Electric Company, P.l.c., England

[21] Appl. No.: 466,941

[22] Filed: Feb. 16, 1983

[30] Foreign Application Priority Data

Feb. 19, 1982 [GB] United Kingdom ............... 8204913

[51] Int. Cl.³ ............................................. G01L 1/16
[52] U.S. Cl. .................................. 73/862.68; 73/651;
310/338; 310/330; 357/26
[58] Field of Search ................... 357/23 I, 23 VT, 26;
310/338, 329, 324, 349, 330, 11; 73/649, 862.68,
651, 658, 654; 367/160

[56] References Cited

U.S. PATENT DOCUMENTS 3,672,985  6/1972  Nathanson et al. ................. 357/23 I
4,378,510  3/1983  Bennett ................................. 357/26

FOREIGN PATENT DOCUMENTS 1088793 10/1967 United Kingdom .

OTHER PUBLICATIONS

Chen et al., "Integrated Silicon Microbeam Pl-FET Accelerometer", IEEE Trans. on Electron Devices, vol. ED-29 (1982), pp. 27-33.

Chen et al., "Thin Film ZnO-MOS Transducer with Virtually D.C. Response", IEEE Ultrasonic Symposium (1980).

Primary Examiner—Charles A. Ruehl
Assistant Examiner—James R. Giebel
Attorney, Agent, or Firm—Kirschstein, Kirschstein, Ottinger & Israel

[57] ABSTRACT

A force sensor comprising a field effect transistor (FET) structure formed on a substrate, having an insulating layer overlying the substrate adjacent to the channel region of the transistor structure. A layer of piezoelectric material overlies the insulating layer, the layer of piezoelectric material having a portion which extends beyond the insulating layer to form a cantilever structure overhanging a portion of the channel region. A control electrode overlies the cantilever structure. Forces acting on the cantilever structure modify the charge distribution in the underlaying channel region, thereby to cause the drain current of the transistor to vary with any variation of force on the cantilever structure.

2 Claims, 2 Drawing Figures

FORCE SENSOR WITH A PIEZOELECTRIC FET

BACKGROUND OF THE INVENTION

I. Field of the Invention

This invention relates to force sensors. It has especial relevance to force sensors suitable for use as vibration sensors.

II. Description of the Prior Art

Whilst known force sensors suitable for use as vibration sensors, such as sensors based on piezoelectric ceramics, are adequate for frequencies above 100 Hz, they lose sensitivity and dynamic range below this frequency. It is one object of the invention to provide a force sensor. wherein this shortcoming is at least mitigated.

SUMMARY OF THE INVENTION

According to the invention a force sensor comprises: a field effect transistor (FET) structure comprising a semiconductor substrate including a source region, a drain region and a channel region between the source and drain regions; an insulating layer overlying said substrate adjacent to said channel region; a layer of a piezoelectric material overlying said insulating layer and having a portion which extends beyond said insulating layer to overhang at least a portion of said channel region; and a control electrode which overlies at least said portion of the piezoelectric layer.

Typically said portion of said piezoelectric layer is of rectangular form.

BRIEF DESCRIPTION OF THE DRAWINGS

Referring now in detail to the drawings.

DESCRIPTION OF THE PREFERRED EMBODIMENT

Figure 1:
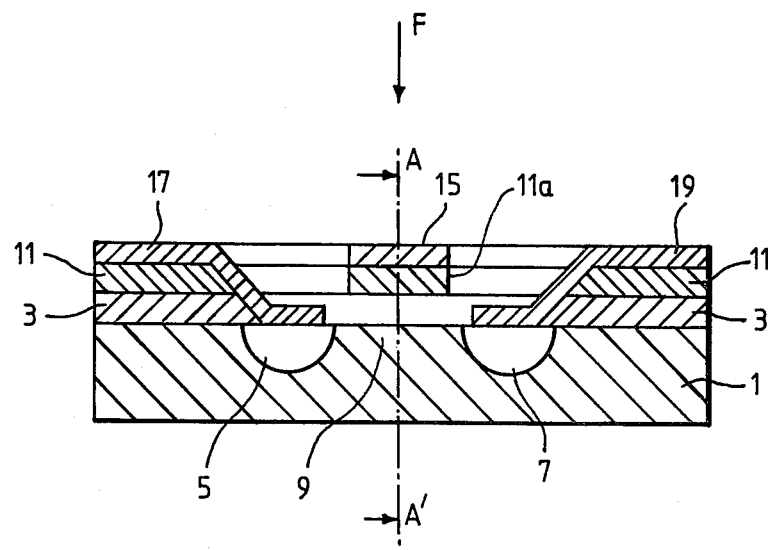
FIG. 1 is a cross section through a force sensor in accordance with the invention for use as a vibration sensor.

Referring firstly to FIG. 1, the sensor comprises an n-channel field effect transistor structure formed in a p-type silicon substrate 1. Two spaced n-type regions 5 and 7 formed in the substrate constitute the source and drain regions of the structure, the part of the substrate between the source 5 and drain 7 constituting the channel region 9 of the structure.

An electrically insulating layer 3 of silicon dioxide overlies the substrate 1 except in the area of the channel region, and over the source and drain regions 5 and 7, as further explained below.

Figure 2:
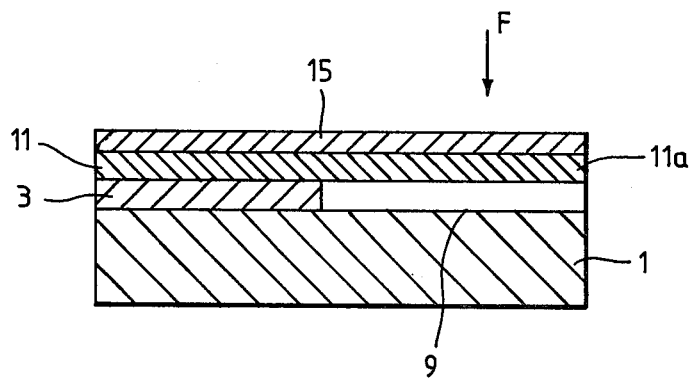
FIG. 2 is a section along the line A—A' of FIG. 1.

Referring now also to FIG. 2, a layer 11 of piezoelectric material, such as zinc oxide or aluminium nitride, is carried on the silicon dioxide layer 3. The piezoelectric layer 11 includes a rectangular portion 11a which extends beyond part of the edge of the silicon dioxide layer 3 so as to overhang the channel region 9. The portion 11a of the piezoelectric layer 11 is thus spaced off from the exposed surface of the channel region 9 by the thickness of the layer 3.

A gate electrode 15 and lead for the structure consisting of electrically conductive material, such as aluminium, overlies the piezoelectric layer 11. Further leads 17 and 19 contacting the source and drain 7 respectively via windows in the piezoelectric layer 11 and silicon dioxide layer 3 constitute the source and drain leads of the structure. The leads and electrode 15 are suitably formed by selective etching of a layer of suitable material in conventional manner.

The overhanging part of the piezoelectric layer 11 is suitably fabricated by arranging for the silicon dioxide layer 3 to extend initially over the channel region 9, and then, after formation of the piezoelectric layer 11, removing part of the layer 3 between the piezoelectric layer 11 and the channel region 9 by anisotropic etching of the layer 3.

It will be appreciated that the part 11a of the piezoelectric layer together with the overlying gate electrode 15 form a cantilever structure free to vibrate in the direction of the arrow F in the drawings. Thus in use, when the device is subject to vibration, the cantilever structure is caused to vibrate. The alternating stresses in the piezoelectric layer portion 11a cause charge of alternating polarity to be generated at the surfaces of the piezoelectric strip 11a. As the charge on the lower surface of the piezoelectric strip 11a affects the depth of the depletion layer in the underlying channel region 9, the drain current of the structure is thus modulated by the vibration. In a typical device the natural frequency of the cantilever structure is in the order of 60 Hz, and thus particular sensitivity is obtained around this frequency.

It will be appreciated that the piezoelectric layer 11 extends beyond the lateral limits of the channel region 9 merely as a manufacturing convenience.

The required natural frequency and other mechanical properties of the cantilever structure may be obtained in a variety of ways. Thus the thickness and material of the layers 11 and 15 will be chosen with a view to obtaining the required mechanical properties as well as the required electrical properties. Alternatively or additionally the layer 15 may be locally thickened or local regions (not shown) of additional material may be provided to obtain a desired mass loading of the structure, or an additional layer (not shown) of suitable material may be incorporated in the structure to stiffen the structure.

It will be understood that in a practical embodiment of the sensor it will normally be desirable to ensure that the piezoelectric layer 11 and the exposed surface of the channel region 9 are electrically isolated from the environment to prevent surface electrical leakage and contamination, and in the case of the channel region, surface traps and defects. Thus, a practical sensor will normally incorporate passivating layers (not shown), for example of silicon dioxide, to provide such isolation, wherever needed. It will be understood that in order to obtain highest sensitivity such passivating layers will be as thin as possible, consistant with conferring the desired isolation from the environment.

It will be appreciated that while the sensor described by way of example is intended for use as a vibration sensor, force sensors in accordance with the invention may find other applications, for example, as pressure transducers or accelerometers, since the drain current will vary with any variation of force on the cantilever structure in the direction of the arrow F.

It will also be appreciated that means for processing the output signal of the sensor such as analogue-digital conversion, filtering, amplification or signal conditioning means will normally be integrated with the sensor on the silicon substrate.

It will be appreciated that whilst the sensor described by way of example comprises an n-channel field effect transistor structure formed in a p-type substrate, other field effect transistor structures, for example comprising a p-channel structure formed in an n-type substrate may be used in a sensor according to the invention.

We claim:

1. A force sensor comprising: a field effect transistor structure comprising a semiconductor substrate including a source region, a drain region and a channel region between the source and drain regions; an insulating layer overlying said substrate adjacent to said channel region; a layer of a piezoelectric material overlying said insulating layer and having a portion which extends beyond said insulating layer to overhang at least a portion of said channel region; and a control electrode which overlies at least said portion of the piezoelectric layer.

2. A sensor according to claim 1 wherein said portion of said piezoelectric layer is of rectangular form.